United States Patent
Ohishi (10) Patent No.: US 8,686,374 B2
(45) Date of Patent: Apr. 1, 2014

(54) DRAWING APPARATUS, AND METHOD OF MANUFACTURING ARTICLE

(75) Inventor: Shinji Ohishi, Oyama (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/606,125

(22) Filed: Sep. 7, 2012

(65) Prior Publication Data

US 2013/0063708 A1    Mar. 14, 2013

(30) Foreign Application Priority Data

Sep. 12, 2011  (JP) .................................. 2011-198865

(51) Int. Cl.
*G21K 5/04*    (2006.01)

(52) U.S. Cl.
USPC ..................... 250/396 R; 250/397; 250/492.1; 700/90; 700/108; 700/109; 700/110; 702/127; 702/134

(58) Field of Classification Search
USPC ........... 250/396 R, 397, 398, 396 ML, 492.1, 250/492.2, 492.21, 492.22, 492.3; 700/2, 3, 700/90, 108, 109, 110; 702/33, 34, 40, 49, 702/127, 134
See application file for complete search history.

(56) References Cited

U.S. PATENT DOCUMENTS

| 4,820,928 A | * | 4/1989 | Ooyama et al. | 250/492.2 |
| 2008/0235535 A1 | * | 9/2008 | Sakai et al. | 714/10 |
| 2012/0248340 A1 | * | 10/2012 | Inoue | 250/492.3 |

FOREIGN PATENT DOCUMENTS

JP    7273006 A    10/1995

* cited by examiner

*Primary Examiner* — Nicole Ippolito
(74) *Attorney, Agent, or Firm* — Rossi, Kimms & McDowell, LLP (57) ABSTRACT

The present invention provides a drawing apparatus including a generation device configured to generate drawing data, a blanking device configured to blank a beam, and a blanking controller includes a first storage device, a second storage device, and a third storage device configured to respectively store the drawing data generated by the generation device, and being configured to control operations of the first storage device, the second storage device, and the third storage device so that an operation of storing the drawing data generated by the generation device in a selected one of the first storage device and the second storage device, and an operation of reading out the drawing data stored in the other of the first storage device and the second storage device, and storing the readout drawing data in the third storage device are executed in parallel.

13 Claims, 11 Drawing Sheets

DRAWING APPARATUS, AND METHOD OF MANUFACTURING ARTICLE

BACKGROUND OF THE INVENTION

1. Field of the Invention

The present invention relates to a drawing apparatus, and a method of manufacturing an article.

2. Description of the Related Art

As one of apparatuses employed in a process of manufacturing, for example, a semiconductor device (lithography process), a multiple charged particle beam drawing apparatus which draws (transfers) a pattern on a substrate with, a plurality of charged particle beams (electron beams) has been proposed in Japanese Patent Laid-Open No. 07-273006. A charged particle beam drawing apparatus makes a blanking deflector control ON and OFF of the irradiation of a substrate with a plurality of charged particle beams (control blanking of these charged particle beams), thereby drawing a pattern on the substrate. More specifically, a blanking control unit which, controls the blanking deflector stores, in a low speed, high capacity storage unit, drawing data which is transmitted front a drawing pattern data generation unit and serves to control the blanking operations of deflectors that constitute the blanking deflector. The drawing data necessary to draw a pattern is transmitted from the low speed, high capacity storage unit to a memory, and read out from the memory in synchronism with the blanking operation of the blanking deflector, thereby drawing a pattern on the substrate.

With miniaturization of semiconductor devices, a charged particle beam drawing apparatus is required to attain a drawing grid with a narrower pitch (a narrower drawing range of each charged particle beam). Also, to improve the productivity of semiconductor devices, the pattern drawing area of the apparatus is often widened by increasing the number of charged particle beams which allow simultaneous drawing. This enormously increases the size of drawing data for controlling the blanking operation of the blanking deflector, so the apparatus must be kept in a standby state until the end of storage (transmission) of the drawing data in (to) the storage unit or memory, thus lowering the throughput. This problem is posed not only in a multiple charged particle beam drawing apparatus but also in a single charged particle beam drawing apparatus.

SUMMARY OF THE INVENTION

The present invention provides, for example, a technique advantageous in terms of throughput of a drawing apparatus.

According to one aspect of the present invention, there is provided a drawing apparatus which performs drawing on a substrate with a beam, the apparatus including a generation device configured re-generate drawing data, a blanking device configured to blank the beats, and a blanking controller configured to control the blanking device, wherein the blanking controller includes a first storage device, a second storage device, and a third storage device configured to respectively store the drawing data generated by the generation device, the blanking controller being configured to control the blanking device based on the drawing data stored in the third storage device, and control operations of the first storage device, the second storage device, and the third storage device so that an operation of storing the drawing data generated by the generation device in a selected one of the first storage device and the second storage device, and an operation of reading out the drawing data stored in the other of the first storage device and the second storage device and storing the readout drawing data in the third storage device are executed in parallel.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1:
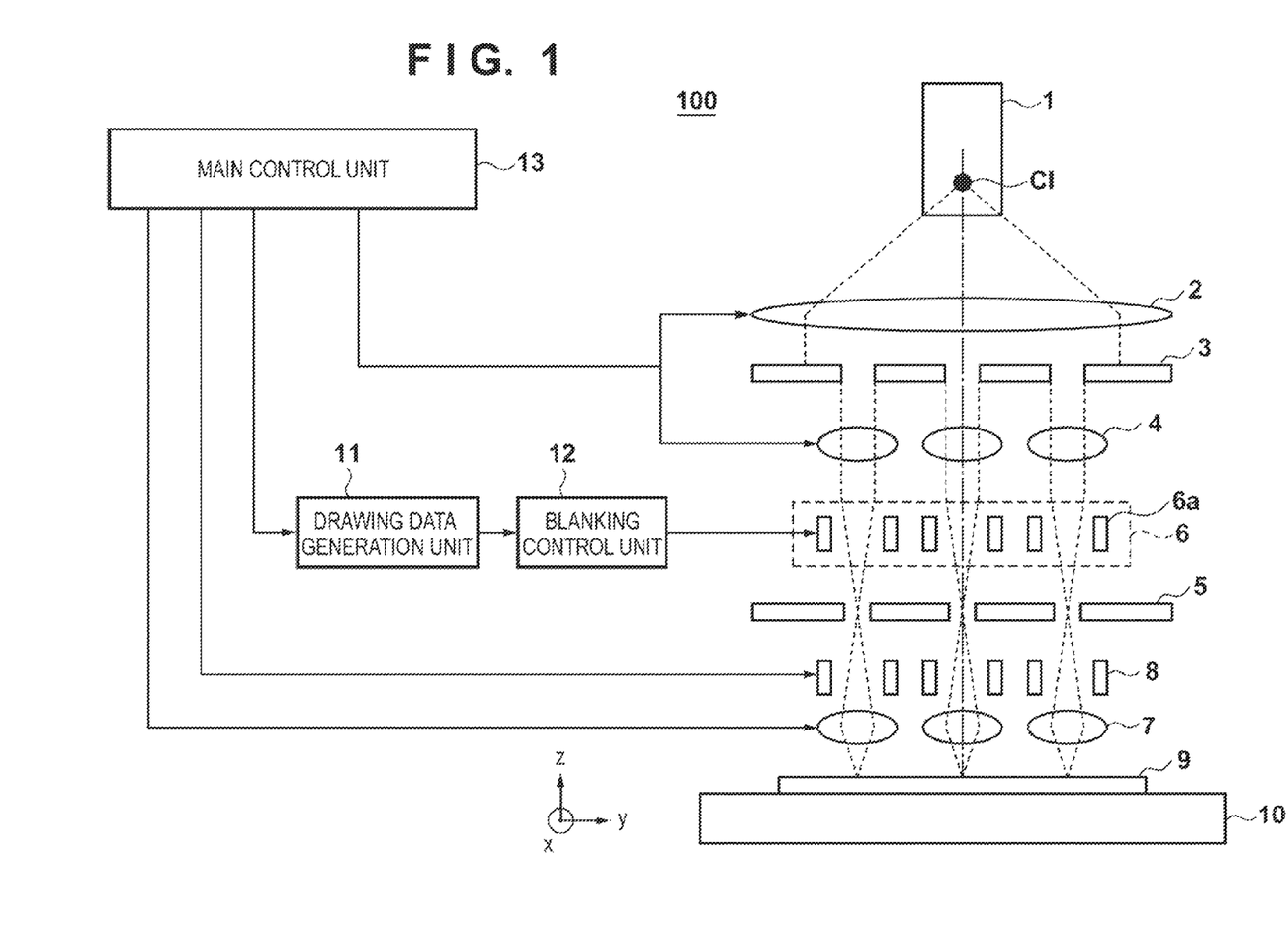
FIG. 1 is a block diagram showing the configuration of a drawing apparatus according to an aspect of the present invention.

FIG. 1 is a block diagram showing the configuration of a drawing apparatus 100 according to an aspect of the present invention. The drawing apparatus 100 draws a pattern on a substrate with a charged particle beam (electron beam), and serves as a multiple charged particle beam drawing apparatus (a drawing apparatus which draws with a plurality of charged particle beams) in this embodiment. However, the drawing apparatus 100 may serve as a single charged particle beam drawing apparatus (a drawing apparatus which draws with a single charged particle beam).

The drawing apparatus 100 includes an electron gun 1, collimator lens 2, aperture array 3, electro-static lens 4, blanking aperture 5, and blanking deflection unit 6. The drawing apparatus 100 also includes an electro-static lens 7, a deflection unit 8, a substrate stage 10 which moves upon holding a substrate 9, a drawing data generation unit 11, a blanking control unit 12, and a main control unit 13.

Referring to FIG. 1, the electron gun 1 forms a crossover image CI. A charged particle beams (electron beam) diverging from the crossover image CI is converted into a nearly collimated charged particle beam via the collimator lens 2, and enters the aperture array 3. The aperture array 3 includes a plurality of circular apertures arrayed in a matrix, and divides the charged particle beam having passed through the collimator lens 2 into a plurality of charged particle beams.

The charged particle beams having passed through the aperture array 3 enter the electro-static lens 41 formed by a plurality of electrode plates (for example, three electrode plates) each including a circular aperture. The blanking aperture 5 including a plurality of minute apertures arrayed in a matrix is placed at the position at which the charged particle beams having passed through the electro-static lens 4 form crossover images for the first time.

The blanking deflection unit 6 includes deflectors 6a which deflect the charged particle beams. The blanking deflection unit 6 performs a blanking operation (ON and OFF of the irradiation of the substrate 9 with each charged, particle beam) in cooperation with the blanking aperture 5, under the control of the blanking control unit 12.

The charged particle beams having passed through the blanking aperture 5 form, via the electrostatic lens 7, images corresponding to the crossover image CI on the substrate 9 held by the substrate stage 10. At this time, the charged particle beams having passed through the blanking aperture & are deflected by the deflection unit 8 including deflectors arranged between the blanking aperture 5 and the electro-static lens 7 (that is, the images formed on the substrate 9 are deflected).

The drawing data generation unit 11 generates drawing data corresponding to a pattern, to be drawn on the substrate 9. Note that the blanking control unit 12 converts the drawing data into bitmap data for controlling the driving of each deflector 6a (bitmap data for turning on or off the driving of each deflector 6a) in the blanking deflection unit 6, as will be described later.

The blanking control unit 12 controls the blanking deflection unit 6 based on the drawing data generated by the drawing data generation unit 11. The configuration and operation of the blanking control unit 12 will be described in detail in the following embodiments.

The main control unit 13 includes, for example, a CPU and memory and controls the overall drawing apparatus 100 (its operation). For example, in drawing a pattern on the substrate 9, the main control unit 13 continuously moves the substrate stage 10 which holds the substrate 9 in the X-axis direction. The main control unit 13 makes the deflection unit 8 deflect images formed on the substrate 9 in the Y-axis direction while making the blanking aperture 5 and blanking deflection unit & blank the charged particle beams via the blanking control unit 12. This draws a pattern on the substrate 9.

Figure 10A:
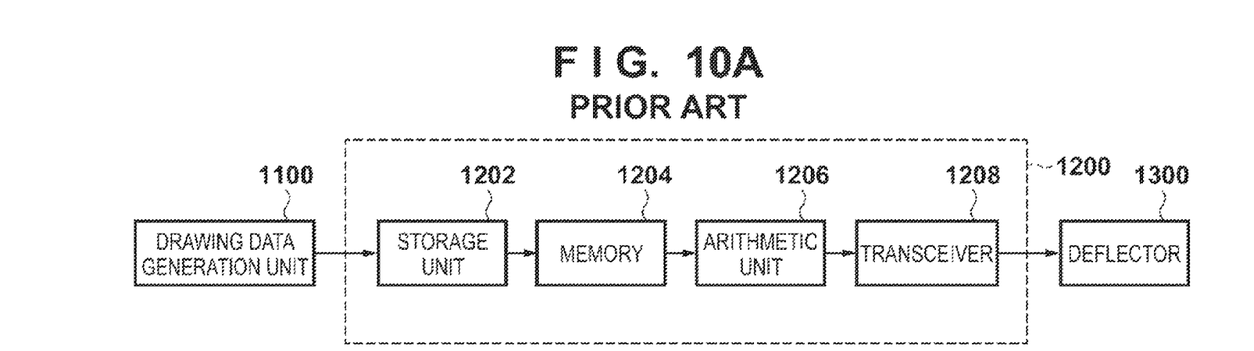
FIGS. 10A and 10B are views for explaining a blanking control unit in the related art technique.
Figure 10B:
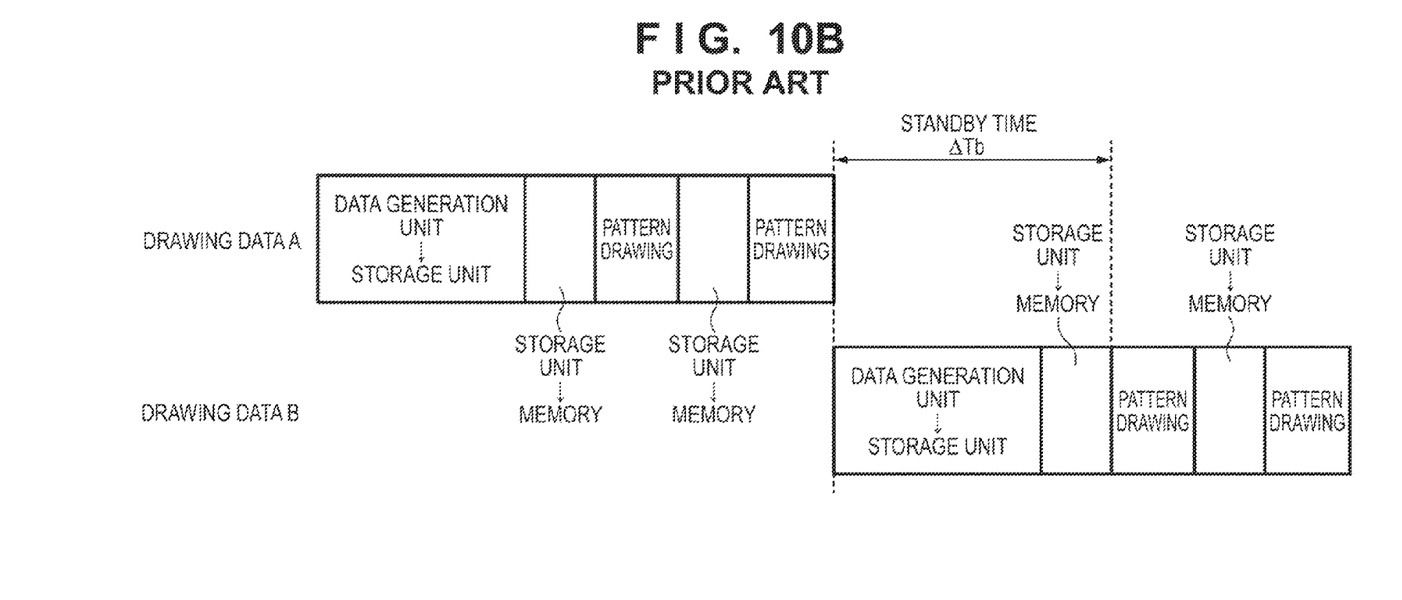

Before a detailed description of the blanking control unit 12 in each embodiment, a blanking control unit 1200 in the related art technique (for example, Japanese Patent Laid-Open No. 07-273006) will be described herein with reference to FIGS. 10A and 10B. FIG. 10A is a block diagram showing the configuration of the blanking control unit 1200, and FIG. 10B is a view showing the operation sequence of the blanking control unit 1200. A drawing data generation unit 1100 generates drawing data A and E corresponding to two types of patterns, respectively.

Drawing data generated by the drawing data generation unit 1100 is transmitted to a storage unit 1202 and stored in the storage unit 1202, as shown in FIG. 10A. The storage unit 1202 is implemented by a low speed, high capacity storage device, for example, a nonvolatile storage device such as a hard, disk drive (HDD) or a solid-state drive (SSD).

Drawing of a pattern corresponding to drawing data A on a substrate is repeated while sequentially reading out drawing data necessary for drawing from the storage unit 1202, and storing them in a memory 1204, as shown in FIG. 10B. At this time, drawing data A stored (expanded) in the memory 1204 is transmitted to an arithmetic unit 1206, and is converted by various arithmetic operations into bitmap data for turning on or off the driving of a deflector 1300 in a blanking deflection unit. The bitmap data is input (transmitted) to the deflector 1300 in the blanking deflection unit via a transceiver 1208.

In the blanking control unit 1200 of the related art technique, to draw a pattern corresponding to drawing data B on the substrate next, drawing data B generated by the drawing data generation unit 1100 must be transmitted to and stored in the storage unit 1202. Therefore, as shown in FIG. 10B, a standby time ΔTb occurs until the start of drawing a pattern corresponding to drawing data B, thus lowering the throughput of a drawing apparatus. It is also possible to increase the storage capacity of the storage unit 1202 so as to store a plurality of drawing data (for example, drawing data A and B) in advance. However, storing a plurality of drawing data in the storage unit 1202 in advance requires not only a considerable time (transmission time), but also a higher cost due to an increase in storage capacity.

To solve this problem, the drawing apparatus 100 uses the blanking control unit 12 configured as will described in the following embodiments, thereby suppressing a decrease in throughput even when patterns corresponding to a plurality of drawing data, respectively, are drawn sequentially.

First Embodiment

Figure 2:
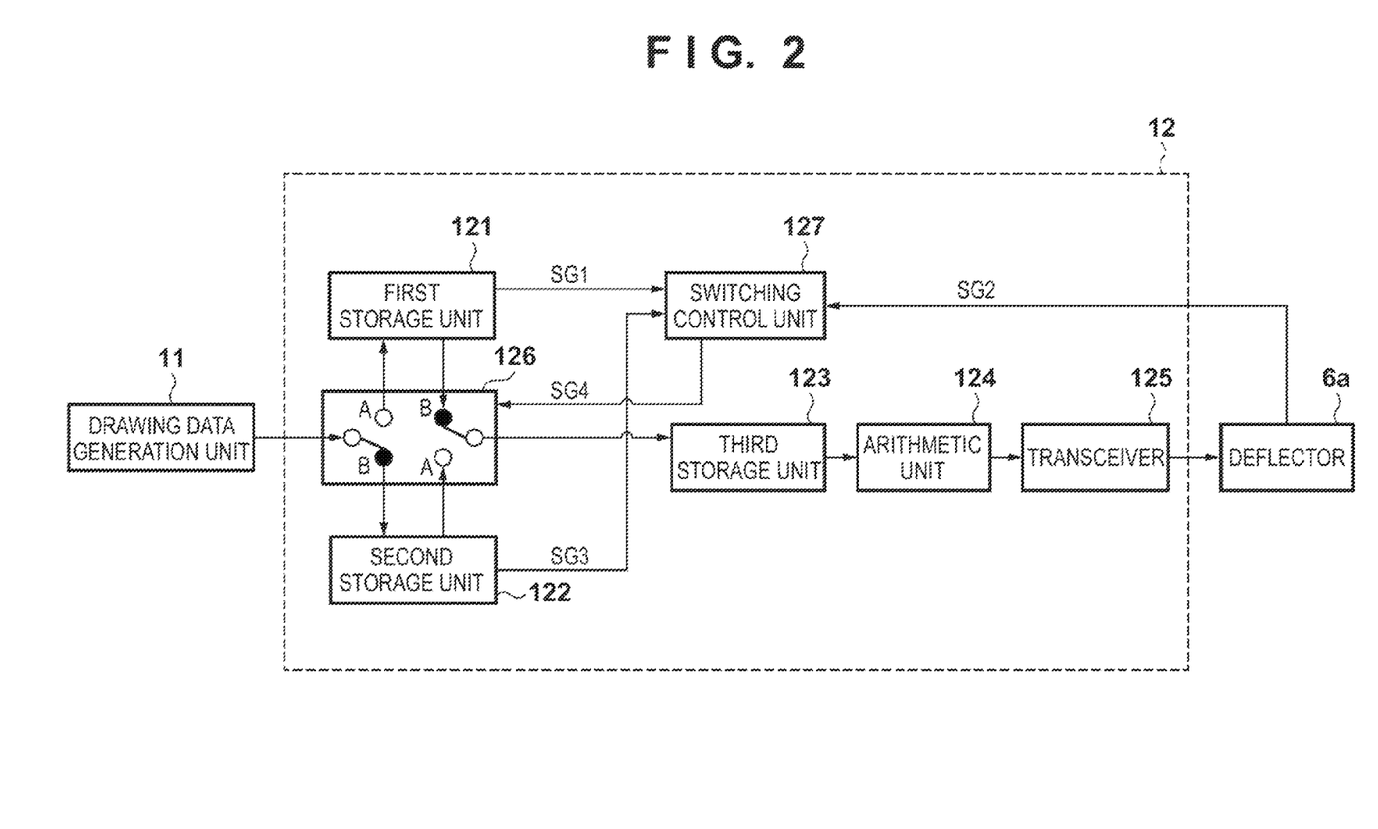
FIG. 2 is a block diagram showing the configuration of a blanking control unit in the first embodiment.

FIG. 2 is a block diagram showing the configuration of a blanking control unit 12 in the first embodiment. In this embodiment, the blanking control unit 12 includes a first storage unit 121, second storage unit 122, and third storage unit 123 which respectively store drawing data, and the first storage unit 121 and second storage unit 121 are arranged in parallel in the preceding stage of the third storage unit 123.

The third storage unit 123 has a storage capacity lower than those of the first storage unit 121 and second storage unit 122, and has a storage speed higher than those of the first storage unit 121 and second storage unit 122. More specifically, each of the first storage unit 121 and second storage unit 122 is implemented by a low speed, high capacity storage device, that is, a nonvolatile storage device such as a hard disk drive (HDD) or a solid-state drive (SSD). Such a storage device has a low storage speed (write speed), but holds data (drawing data) even after a shutdown and therefore need not transmit the data again (store it again) upon a restart. On the other hand, the third storage unit 123 is implemented by a high speed, low capacity storage device, that is, a semiconductor memory (DDR memory) from which drawing data can be read out at high speed, so as to drive a deflector 6a in a blanking deflection unit 6 at high speed.

The blanking control unit 12 also includes an arithmetic unit 124 and transceiver 125. The arithmetic unit 124 converts, by various arithmetic operations, drawing data stored in the third storage unit 123 into bitmap data for turning on or off the driving of the deflector 6a, and inputs the bitmap data to the deflector 6a via the transceiver 125. In this manner, the arithmetic unit 124 functions as a control unit (first control unit) which controls ON and OFF of the irradiation of a substrate 9 with a charged particle beam by driving the deflector 6a, based on the drawing data stored in the third storage unit 123.

The blanking control unit 12 moreover includes a switching unit 126 and a switching control unit (second control unit) 127 which controls the switching unit 126 so that the flow of drawing data generated by a drawing data generation unit 11 can be switched.

The switching unit 126 is implemented by switches which switch the state of connection among the drawing data generation unit 11, the first storage unit 121, the second storage unit 122, and the third storage unit 123. As shown in FIG. 2, the switching unit 126 selects (sets) switch A to set state A (second state) in which the second storage unit 122 and the third storage unit 123 are connected to each other, and the drawing data generation unit 11 and the first storage unit 121 are connected to each other. Also, the switching unit 126 selects (sets) switch B to set state B (first state) in which the first storage unit 121 and the third storage unit 123 are connected to each other, and the drawing data generation unit 11 and the second storage unit 122 are connected to each other.

The switching control unit 127 controls the switching unit 126 to parallelly execute a first-operation associated with storage of drawing data in the first storage unit 121 or second storage unit 122, and a second operation associated with storage of drawing data in the third storage unit 123. Note that in the first operation, drawing data transmitted from the drawing data generation unit 11 is stored in the selected one of the first storage unit 121 and second storage unit 122. Also, in the second operation, drawing data stored in the other of the first storage unit 121 and second, storage unit 122 is read out and stored in the third storage unit 123. Therefore, an operation of storing drawing data from the drawing data generation unit 11 in the first storage unit 121, and an operation of reading out drawing data stored in the second storage unit 122, and storing it in the third storage unit 123 are parallelly executed in state A. Also, an operation of storing drawing data from the drawing data generation unit 11 in the second storage unit 122, and an operation of reading out drawing data stored in the first storage unit 121, and storing it in the third storage unit 123 are parallelly executed in state B.

Figure 3:
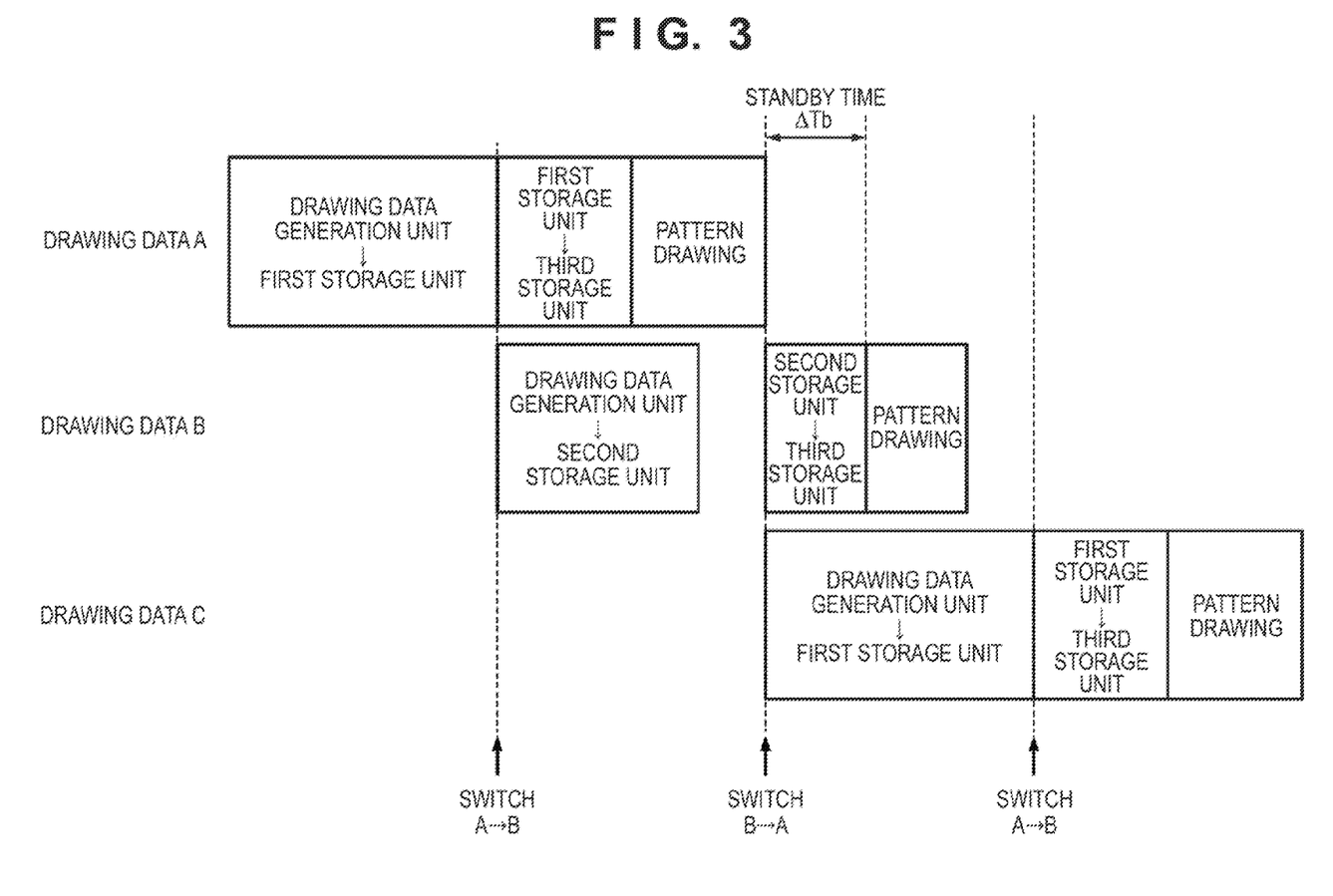
FIG. 3 is a view for explaining the operation sequence of the blanking control unit in the first embodiment.

The operation sequence of the blanking Control unit 12 in this embodiment will be described with reference to FIG. 3. The drawing data generation unit 11 generates drawing data A, B, and C corresponding to three types of patterns, respectively. First, the switching control unit 127 selects switch A (that is, sets state A) in the switching unit 126 to store drawing data A transmitted from the drawing data generation unit 11 in the first storage unit 121. When the switching control unit 127 receives a signal SG1 indicating completion of storage of drawing data A transmitted from the drawing data generation unit 11 in the first storage unit 121, it selects switch B in the switching unit 126 to switch the state of connection from state A to state B. The blanking control unit 12 then parallelly executes an operation of reading out drawing data A stored in the first storage unit 121, and storing it in the third storage unit 123, and an operation of storing drawing data B transmitted from the drawing data generation unit 11 in the second storage unit 122.

After the storage of drawing data A in the third storage unit 123 is completed, the arithmetic unit 124 converts drawing data A into bitmap data by various arithmetic operations (correction operations) such as magnification correction and proximity effect correction. The bitmap data is input to the deflector 6a via the transceiver 125 to draw a pattern corresponding to drawing data A. Even, while a pattern corresponding to drawing data A is drawn, the operation of storing drawing data B transmitted from the drawing data generation unit 11 in the second storage unit 122 continues. Also, in this embodiment, the deflector 6a (blanking deflection unit 6) transmits to the switching control unit 127 a signal SG2 indicating completion of driving of the deflector 6a based on drawing data A which is read out from the first storage unit 121 and stored in the third, storage unit 123. This guarantees transmission of drawing data from the transceiver 125 to the deflector 6a with no errors (that is, correct completion of drawing of a pattern corresponding to drawing data A).

When the switching control unit 127 receives both the signal SG2, and a signal SG3 indicating completion of storage of drawing data B transmitted from the drawing data generation unit 11 in the second storage unit 122, it selects switch A in the switching unit 126 to switch the state of connection from state B to state A. The blanking control unit 12 then parallelly executes an operation of reading out drawing data B stored in the second storage unit 122, and storing it in the third storage unit 123, and an operation of storing drawing data C transmitted from the drawing data generation unit 11 in the first storage unit 121. After the storage of drawing data B in the third storage unit 123 is completed, a pattern corresponding to drawing data B is drawn. Even while a pattern corresponding to drawing data B is drawn, the operation of storing drawing data C transmitted from the drawing data generation unit 11 in the first storage unit 121 continues. Also, when the switching control unit 127 receives both the signal SG2, and a signal SG1 indicating completion of storage of drawing data C transmitted from the drawing data generation unit 11 in the first storage unit 121, it selects switch B in the switching unit 126 to switch the state of connection from, state A to state B.

Figure 4:
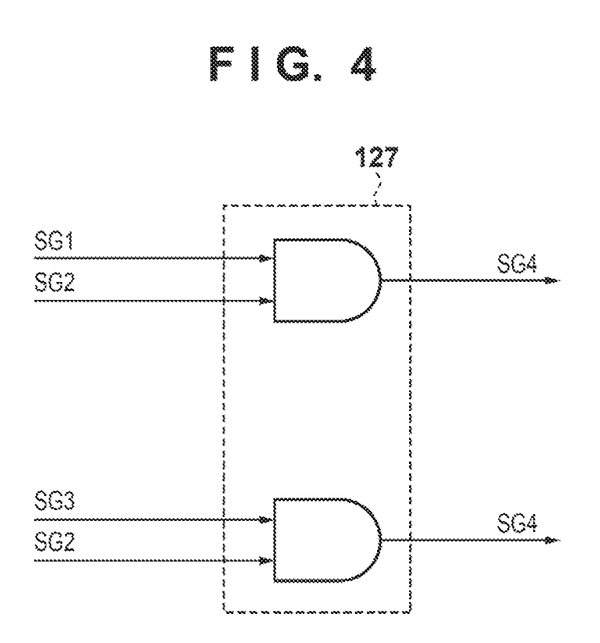
FIG. 4 is a circuit diagram schematically illustrating an example of the logic of switching from one switch to another in a switching unit by a switching control unit.

FIG. 4 is a circuit diagram schematically illustrating an example of the logic of switching from one switch to another in the switching emit 126 by the switching control unit 127. Switching from switch A to switch B is done under the condition in which storage of drawing data transmitted from the drawing data generation unit 11 in the first storage unit 121 is complete, and storage, in the third storage unit 123, of drawing data stored in the second storage unit 122 is complete. Similarly, switching from switch B to switch A is done under the condition in which storage of drawing data transmitted from the drawing data generation unit 11 in the second storage unit 122 is complete, and storage, in the third storage unit 123, of drawing data stored in the first storage unit 121 is complete.

Hence, in state A, when the switching control unit 127 receives both the signal SG1 from the first storage unit 121 and the signal SG2 from the deflector 6a, it generates and inputs a signal SG4 for switching from switch A to switch B to the switching unit 126, as shown in FIG. 4. Similarly, in state B, when the switching control unit 127 receives both the signal SG3 from the second storage unit 122 and the signal SG2 from the deflector 6a, it generates and inputs a signal SG4 for switching from switch B to switch A to the switching unit 126. Note that the signal SG1 indicates completion of storage of drawing data transmitted from, the drawing data generation unit 11 in the first storage unit 121, and the signal SG3 indicates completion of storage of drawing data transmitted from the drawing data generation unit 11 in the second storage unit 122. Also, the signal SG2 indicates completion of driving of the deflector 6a based on drawing data stored in the third storage unit 123.

As described above, in this embodiment, the blanking control unit 12 includes the first storage unit 121 and second storage unit 122 implemented by low speed, high capacity storage devices, and the third storage unit 123 implemented by a high speed, low capacity storage device. This makes it possible to parallelly execute an operation of storing drawing data transmitted from the drawing data generation unit 11 in the selected one of the first storage unit 121 and the second storage unit 122, and an operation of reading out drawing data stored in the other, and storing it in the third storage unit 123. Therefore, in this embodiment, compared to the related art technique (see FIGS. 10A and 10B), the standby time ΔTb until the start of drawing of a pattern corresponding to drawing pattern B can be greatly shortened, thereby suppressing a decrease in throughput due to the standby time ΔTb, as shown in FIG. 3.

Also, the third storage unit 123 must be implemented by, for example, an expensive semiconductor memory so as to drive the deflector 6a in the blanking deflection unit 6 at high speed. However, it is difficult in terms of cost to increase the storage capacity of the third storage unit 123 so as to store a plurality of drawing data, as described above. In this embodiment, instead of increasing the number of storage units (third storage units) implemented by, for example, expensive semiconductor memories, only two storage units (first and second storage units) implemented by, for example, inexpensive hard disk drives are provided, offering an advantage in terms of cost.

Although not shown in FIG. 2, the first storage unit 121, second storage unit 122, and third storage unit 123 are in practice provided with controllers which respectively control their operations. A network controller is also provided because the drawing data generation unit 11 transmits drawing data via a network such as Ethernet. These controllers, arithmetic unit 124, transceiver 125, switching unit 126, and switching control unit 127, for example, can also be implemented by, for example, integrate circuits (FPGAs).

Figure 5:
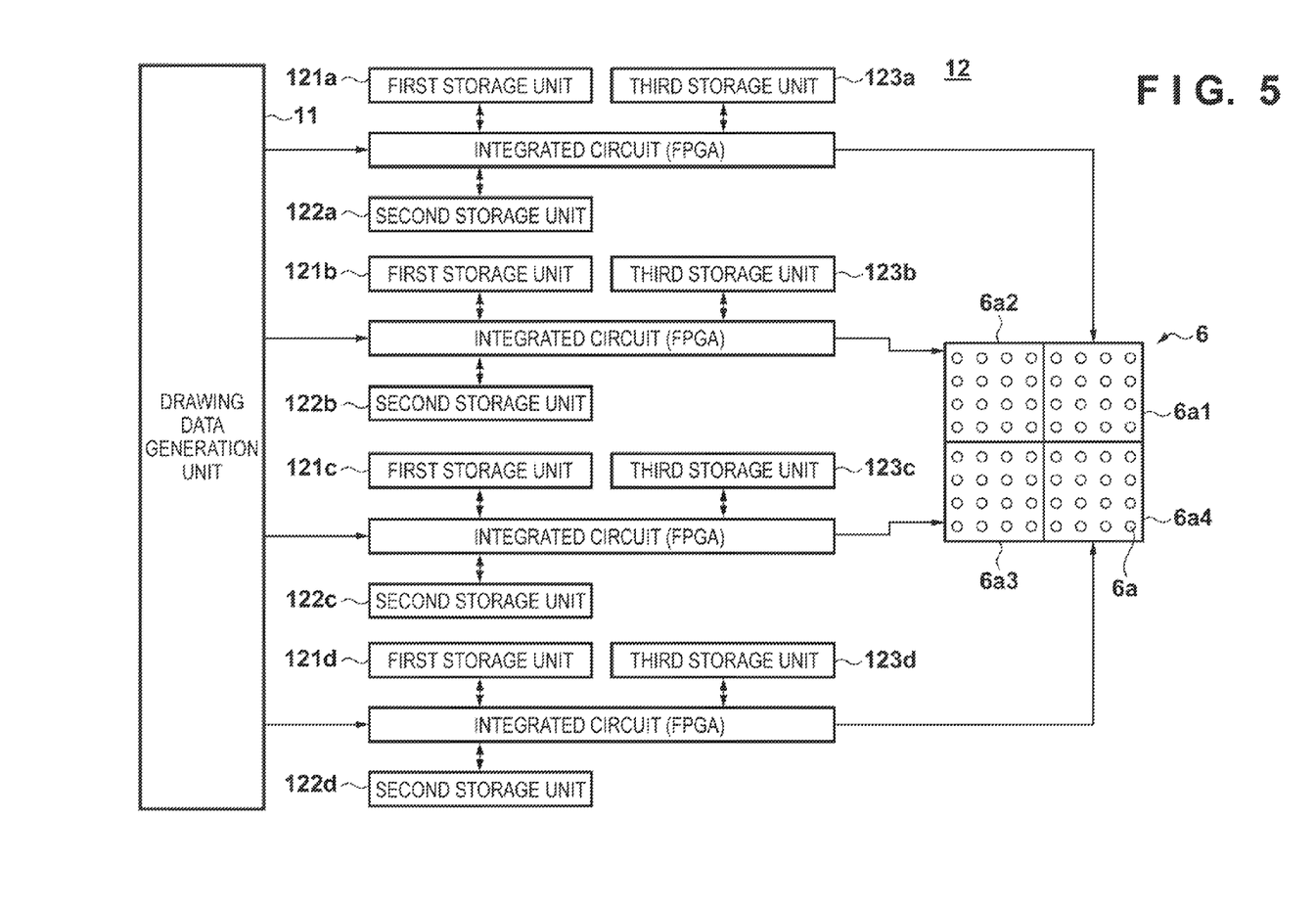
FIG. 5 is a block diagram showing the configuration of a blanking control unit including a plurality of first storage units, a plurality of second storage units, and a plurality of third storage units.

Because drawing; data generated by the drawing data generation unit 11 is fine grid data on the order of about several nanometers, drawing data corresponding to one pattern is generally an enormous amount of data on the order of several terabytes. It is difficult to store such drawing data in one storage unit (first or second storage unit) implemented by, for example, a hard disk, so the first storage unit 121, second storage unit 122, and third storage unit 123 may be Implemented by multilevel storage units, as shown in FIG. 5. Referring to FIG. 5, the drawing data is divided into four independent drawing data in correspondence with deflectors 6a1 to 6a4 in the blanking deflection unit 6. To store each divided drawing data, the blanking control unit 12 includes four first storage units 121a to 121d, four second storage units 122a to 122d, and four third storage units 123a to 123d. The blanking control unit 12 also includes four integrated circuits (FPGAs) which form, for example, the arithmetic unit 124, transceiver 125, switching unit 126, and switching control unit 127, respectively.

Second Embodiment

Figure 6:
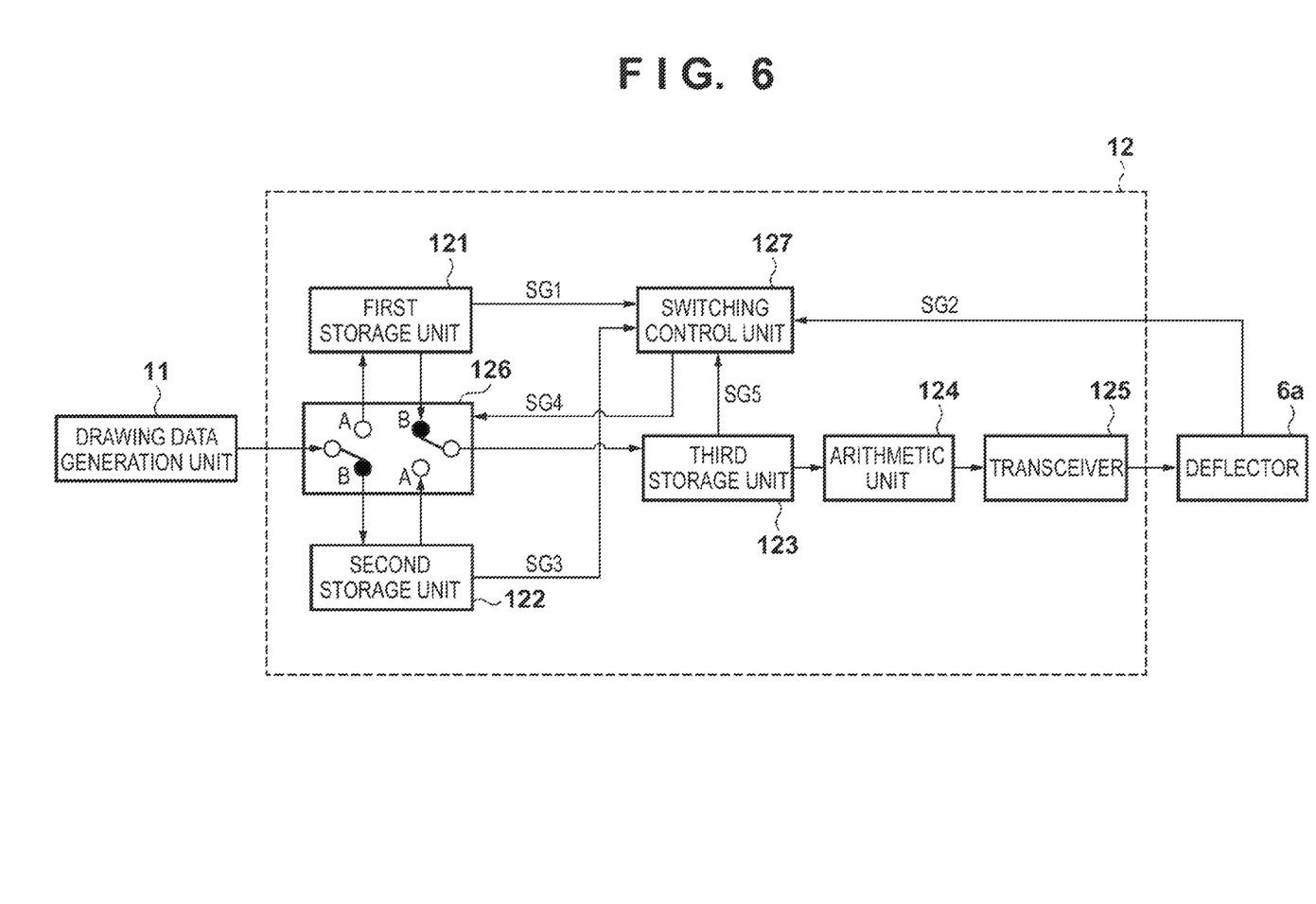
FIG. 6 is a block diagram showing the configuration of a blanking control unit in the second embodiment.

FIG. 6 is a block diagram showing the configuration of a blanking control unit 12 in the second embodiment. The blanking control unit 12 in the second embodiment is different from the blanking control unit 12 in the first embodiment in that in the former a signal SG5 indicating completion of storage of drawing data read out from a first storage unit 121 or a second storage unit 122 in a third storage unit 123 is input to a switching control unit 127.

Figure 7A:
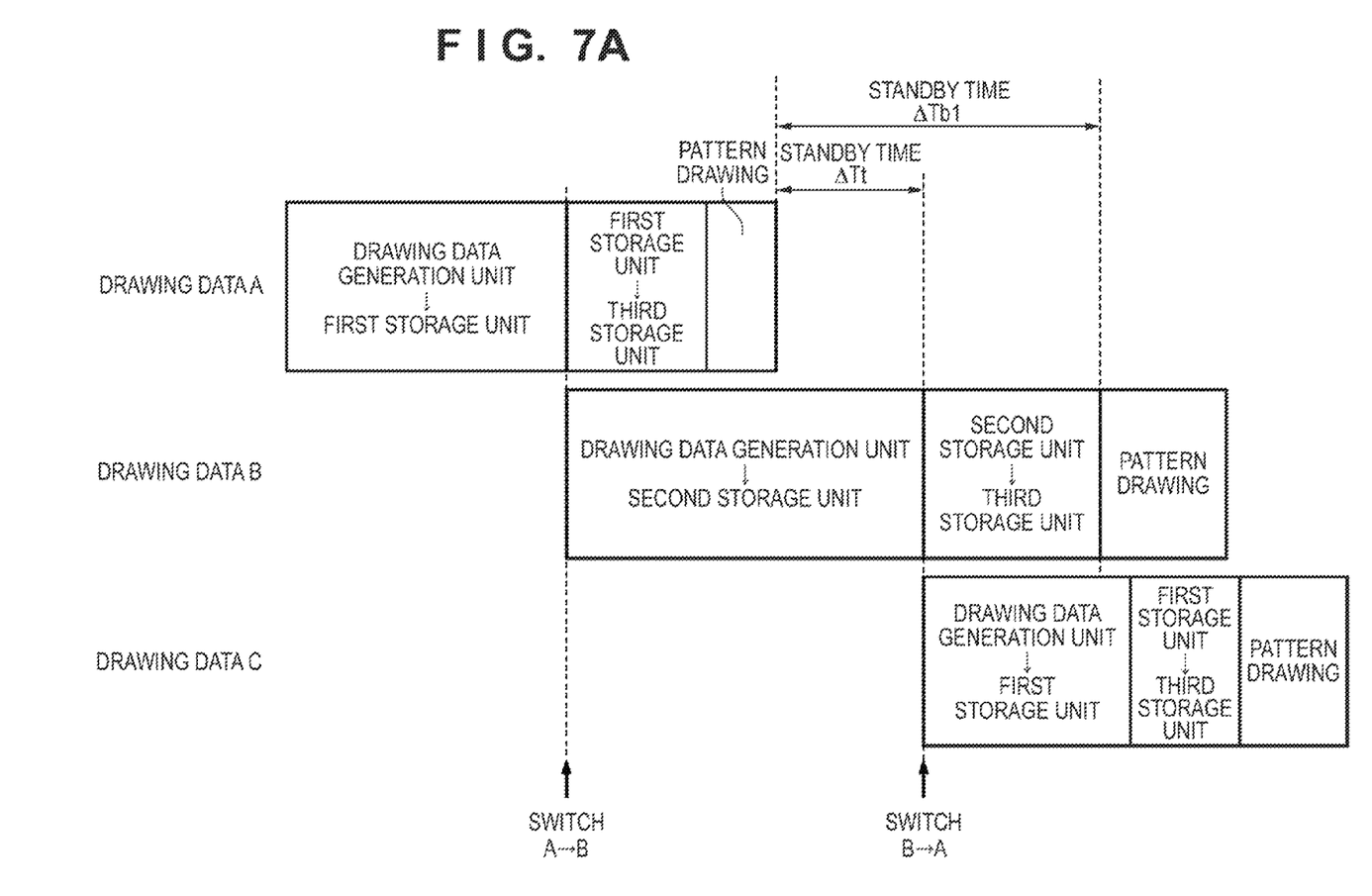
FIGS. 7A and 7B are views for explaining the operation sequence of the blanking control unit in the second embodiment.

The operation sequence of the blanking control unit 12 in the second embodiment will be described with reference to FIGS. 7A and 7B, based on a comparison with the first embodiment. FIG. 7A shows the operation sequence in the first embodiment, and FIG. 7E shows the operation sequence in the second embodiment. In the second embodiment, a standby time ΔTt until completion of an operation of storing drawing data transmitted from a drawing data generation unit 11 in the first storage unit 121 or second storage unit 122 (this operation is executed in parallel with an operation of drawing a pattern) is omitted. Therefore, a standby time ΔTb1 until the start of drawing a pattern can be shortened, thereby improving the throughput.

Referring to the operation sequence in the first embodiment shown in FIG. 7A, an operation of storing drawing data 8 transmitted from the drawing data generation unit 11 in the second storage unit 122 is incomplete when an operation of drawing a pattern corresponding to drawing data A has just been completed. In such a case, in the first embodiment, switching from switch B to switch A in a switching unit 126 is done after waiting until completion of storage of drawing data B transmitted from the drawing data generation unit 11 in the second storage unit 122, as shown in FIG. 7A. This generates a standby time ΔTt, thus lowering the throughput of a drawing apparatus 100.

Figure 7B:
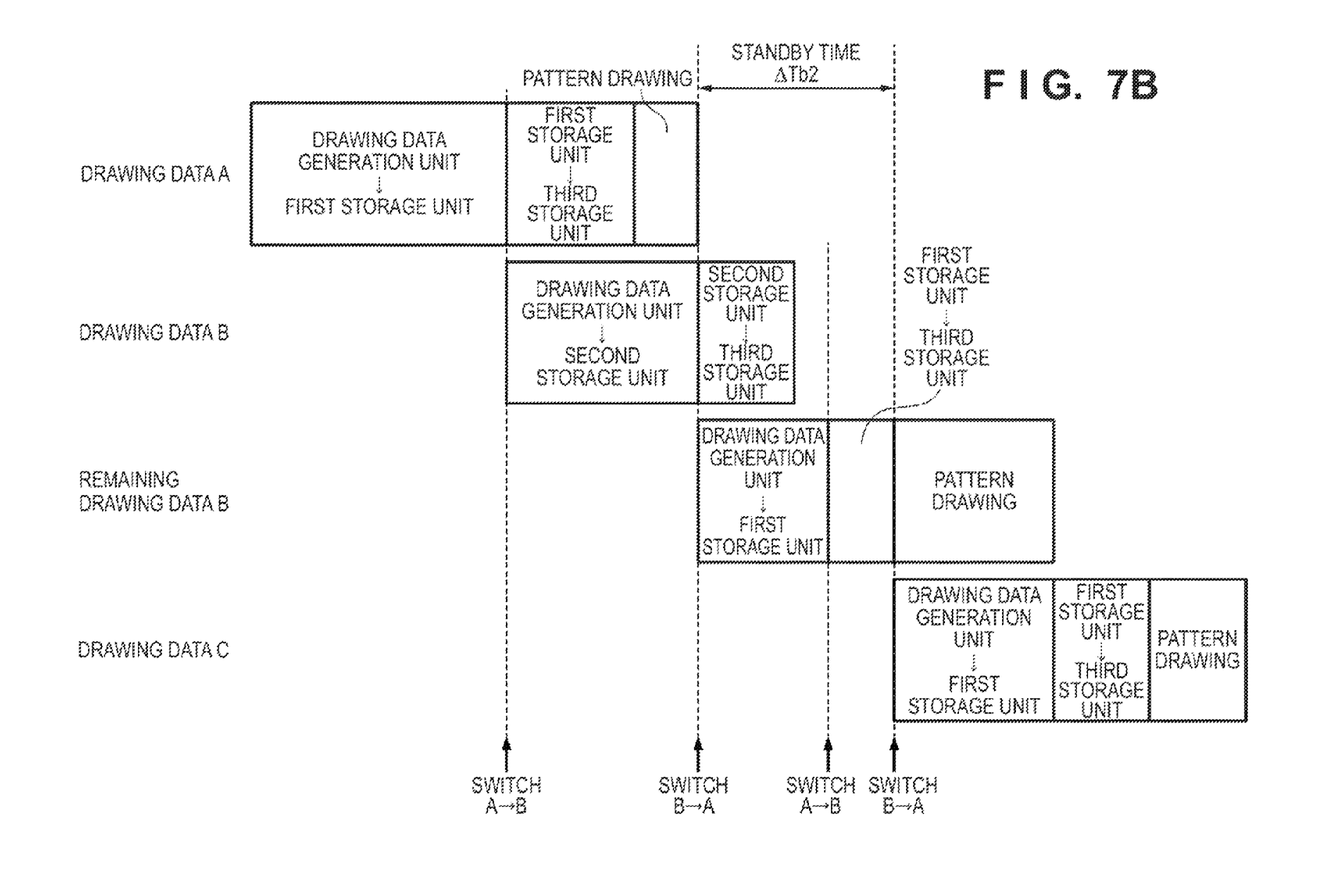

On the other hand, in the second embodiment, switching from switch B to switch A in the switching unit 126 is done when an operation of drawing a pattern corresponding to drawing data A has just been completed, as shown in FIG. 7B. At this time, if an operation of storing drawing data B transmitted from the drawing data generation unit 11 in the second storage unit 122 is incomplete, remaining drawing data B which is not stored in the second storage unit 122 yet is stored in the first storage unit 121. The blanking control unit 12 then parallelly executes an operation of storing the remaining drawing data B in the first storage unit 121, and an operation of reading out drawing data B (drawing data B other than the remaining drawing data B) stored in the second storage unit 122, and storing it in the third storage unit 123. The moment these two operations are completed, switching from switch A to switch B is done to read out the remaining drawing data B stored in the first storage unit 121 and store it in the third storage unit 123 (that is, to store entire drawing data B in the third storage unit 123). The moment the storage of drawing data B in the third storage unit 123 is completed, switching from switch B to switch A is done. At this time, switching from switch B to switch A is done when the switching control unit 127 receives a signal SG5 indicating completion of storage of drawing data B in the third storage unit 123. The blanking control unit 12 then parallelly executes an operation of drawing a pattern corresponding to drawing data B, and an operation of storing drawing data C transmitted from the drawing data generation unit 11 in the first storage unit 121.

As described above, in this embodiment, in state A, when the switching control unit 127 receives a signal SG2 indicating completion of driving of a deflector 6a based on drawing data which is read out from the first storage unit 121 and stored in the third storage unit 123, it switches the state of connection from state A to state B. Also, upon switching of the state of connection from state A to state B, when the switching control unit 127 does not receive a signal SG3 indicating completion of storage of drawing data transmitted from the drawing data generation unit 11 in the second storage unit 122, two operations are parallelly executed in the following way. That is, an operation of storing, in the first storage unit 121, remaining drawing data which is not stored in the second storage unit 122 yet, and an operation of reading out drawing data other than the remaining drawing data, which is stored in the second storage unit 1.22, and storing it in the third storage unit 123 are executed parallelly.

Similarly, in this embodiment, in state 3, when the switching control unit 127 receives a signal SG2 indicating completion of driving of the deflector 6a based on drawing data which is read out from the second storage unit 122 and stored in the third storage unit 123, it switches the state of connection from state E to state A. Also, upon switching of the state of connection from state B to state A, when the switching control unit 127 does not receive a signal SG1 indicating completion of storage of drawing data transmitted from the drawing data generation unit 11 in the first storage unit 121, two operations are parallelly executed in the following way. That is, an operation of storing, in the second storage unit 122, remaining drawing data which is not stored in the first storage unit 121 yet, and an operation of reading out drawing data other than the remaining drawing data, which is stored in the first storage unit 121, and storing it in the third storage unit 123 are executed parallelly.

Therefore, in this embodiment, a standby time ΔTb2 until the start of drawing a pattern can be made shorter than that in the first embodiment (ΔTb1), thereby further improving the throughput of the drawing apparatus 100, as shown in FIG. 7B.

Third Embodiments

Figure 8:
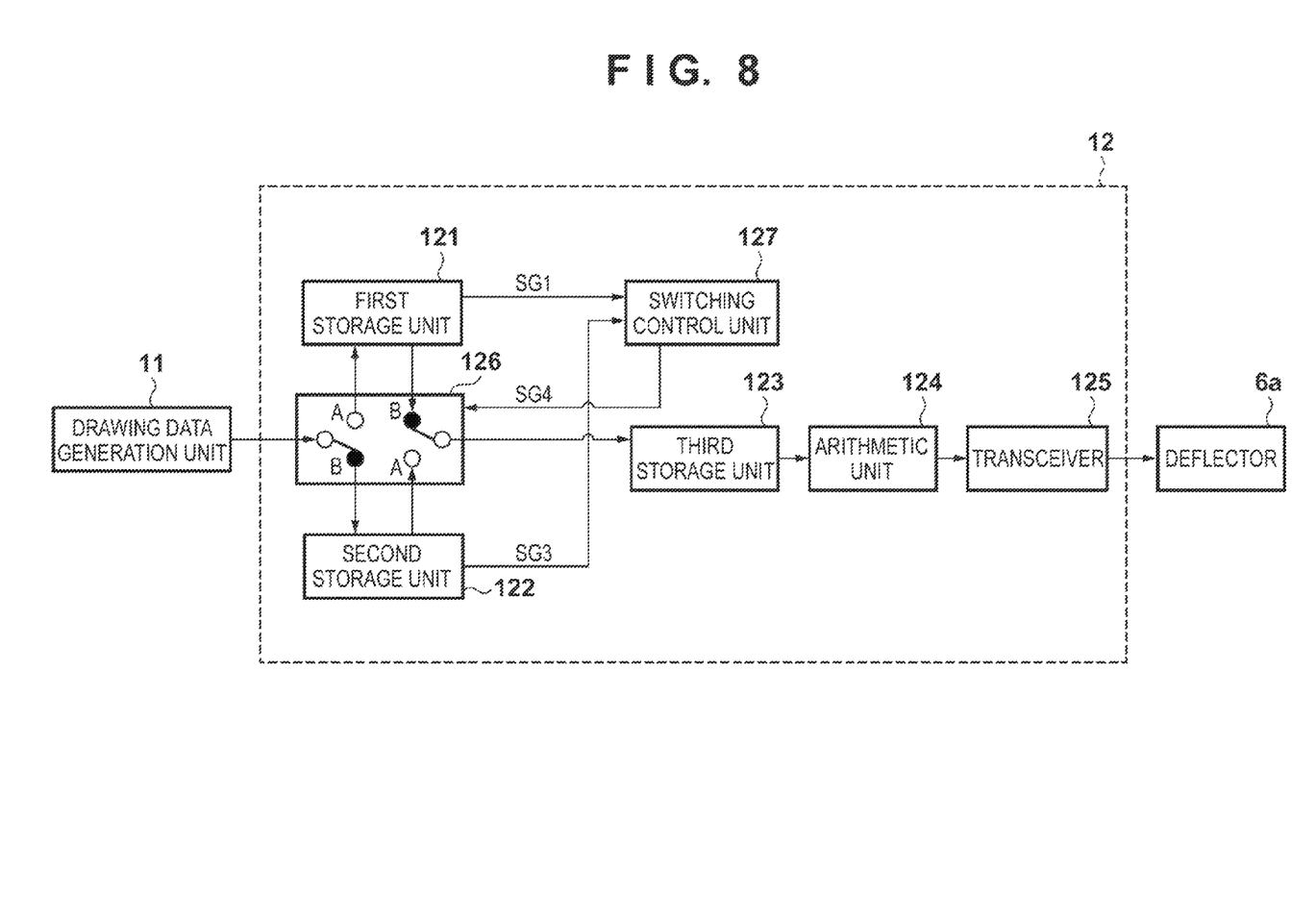
FIG. 8 is a block diagram showing the configuration of a blanking control unit in the third embodiment.

FIG. 8 is a block diagram showing the configuration of a blanking control unit 12 in the third embodiment. The blanking control unit 12 in the third embodiment is different from the blanking control, unit 12 in the first embodiment in that in the former a signal SG2 indicating completion of driving of a deflector 6a based on drawing data stored in a third storage unit 123 is not input to a switching control unit 127.

Figure 9:
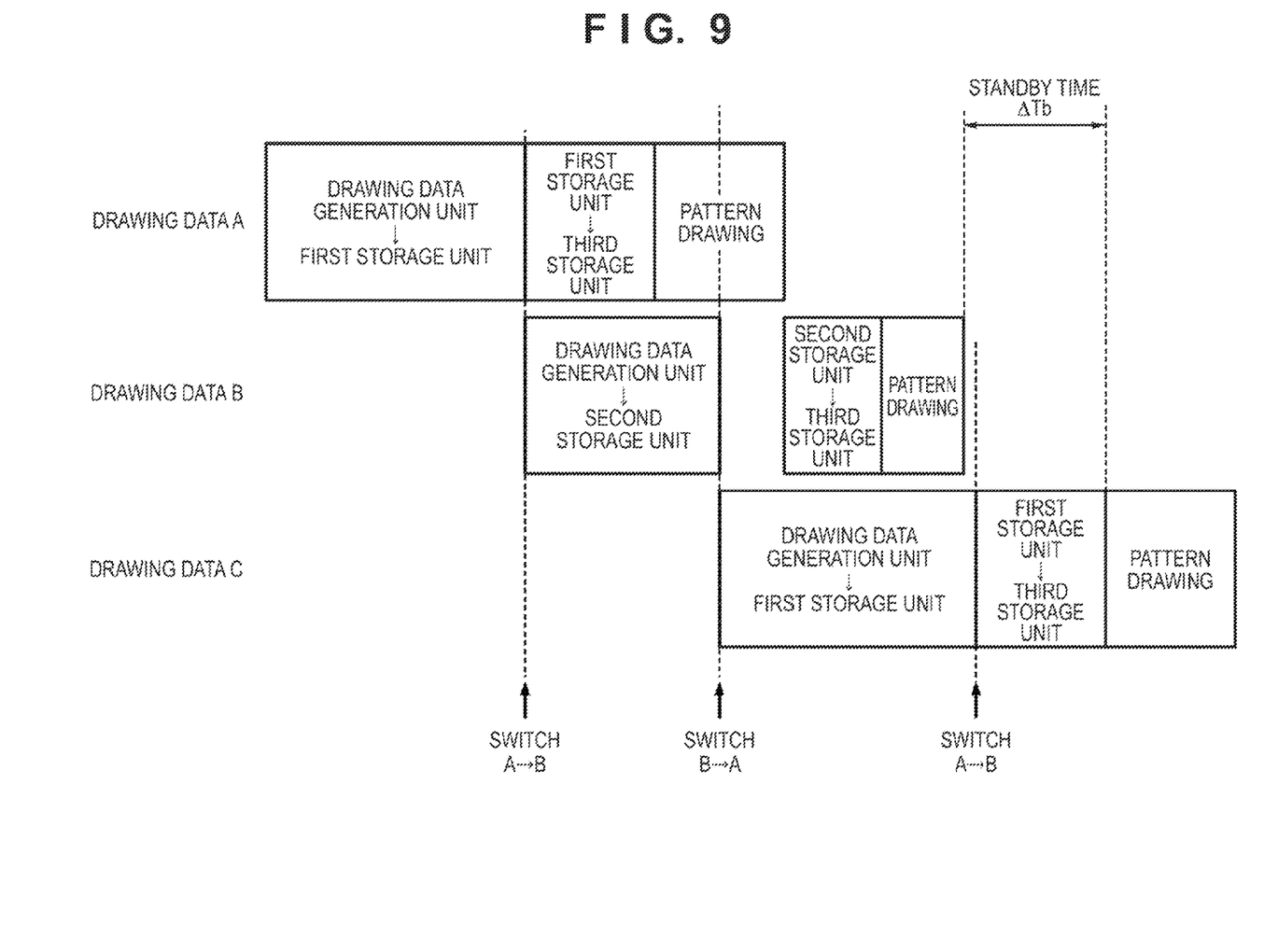
FIG. 9 is a view for explaining the operation sequence of the blanking control unit in the third embodiment.

The operation sequence of the blanking control unit 12 in the third embodiment will be described with reference to FIG. 9. In this embodiment, after an operation of storing drawing data B transmitted from a drawing data generation unit 11 in a second storage unit 122 is completed, switching from switch B to switch A in a switching unit 126 is done without waiting until an operation of drawing a pattern corresponding to drawing data A is completed. Therefore, an operation of drawing a pattern corresponding to drawing data A, and an operation of storing drawing data C transmitted from, the drawing data generation unit 11 in a first storage unit 121 are executed parallelly. However, because drawing data A is read out from the first, storage unit 121 and stored in the third, storage unit 123, drawing pattern C can be stored in the first storage unit 121.

As described above, in this embodiment, in state A, when the switching control unit 127 receives a signal SG3 indicating completion of storage of drawing data transmitted from the drawing data generation unit 11 in the second storage unit 122, it switches the state of connection from state A to state B. Similarly, in state B, when the switching control unit 127 receives a signal SG1 indicating completion of storage of drawing data transmitted from the drawing data generation unit 11 in the first storage unit 121, it switches the state of connection from state A to state B.

Therefore, in this embodiment, a standby time ΔTb until the start of drawing a pattern corresponding to drawing data C can be shortened, thereby improving the throughput of a drawing apparatus 100. However, in this embodiment, new drawing data (drawing data C in this embodiment) is stored in a storage unit which stores drawing data used in drawing the current pattern (the first storage unit 121 which stores drawing data A in this embodiment). Therefore, if drawing of the current pattern is not completed normally (if, for example, drawing data is not correctly transmitted from a transceiver 125 to the deflector 6a), the drawing data generation unit 11 must transmit drawing data again.

A method of manufacturing an article according to an embodiment of the present invention is suitable for manufacturing an article including a microdevice such as a semiconductor device or an element having a microstructure. This method includes a step of forming a latent image pattern on a photosensitive agent, applied on a substrate, using the drawing apparatus 100 (a step of drawing on a substrate), and a step of developing the substrate having the latent image pattern formed on it in the forming step. This method also includes subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application NO. 2011-198865 filed on Sep. 12, 2011, which is hereby incorporated by reference herein in its entirety.

What is claimed is:

1. A drawing apparatus which performs drawing on a substrate with a beam, the apparatus comprising:
    a generation device configured to generate drawing data;
    a blanking device configured to blank the beam; and
    a blanking controller configured to control the blanking device,
    wherein the blanking controller includes a first storage device, a second storage device, and a third storage device configured to respectively store the drawing data generated by the generation device,
    the blanking controller being configured to
    control the blanking device based on the drawing data stored in the third storage device, and
    control operations of the first storage device, the second storage device, and the third storage device so that an operation of storing the drawing data generated by the generation device in a selected one of the first storage device and the second storage device, and an operation of reading out the drawing data stored in the other of the first storage device and the second storage device and storing the readout drawing data in the third storage device are executed in parallel.

2. The apparatus according to claim 1, wherein the blanking controller includes a switching device configured to switch a state of connection among the first storage device, the second storage device, and the third storage device between a first state in which the first storage device and the third storage device are connected to each other, and the generation device and the second storage device are connected to each other, and a second state in which the second storage device and the third storage device are connected to each other, and the generation device and the first-storage device are connected to each other, and
    the blanking controller is configured to control the operations of the first storage device, the second storage device, and the third storage device so that an operation of storing the drawing data generated by the generation device in the second storage device, and an operation of reading out the drawing data stored in the first storage device and storing the readout drawing data in the third storage device are executed in parallel in the first state, and so that an operation of storing the drawing data generated by the generation device in the first storage device, and an operation of reading out the drawing data, stored in the second storage device and storing the readout drawing data in the third storage device are executed in parallel in the second state.

3. The apparatus according to claim 2, wherein the blanking controller is configured to switch the state of connection from the first state to the second state using the switching device after storing in the second storage device is completed, and control of the blanking device based on the drawing data stored in the third storage device is completed, in the first state, and switch the state of connection from the second state to the first state using the switching device after storing in the first storage device is completed, and control of the blanking device based on the drawing data stored in the third storage device is completed, in the second state.

4. The apparatus according to claim 2, wherein the blanking controller is configured to switch the state of connection from the first state to the second state using the switching device after control of the blanking device is completed in the first state, and switch the state of connection from the second state to the first state using the switching device after control of the blanking device is completed in the second state.

5. The apparatus according to claim 4, wherein the blanking controller is configured to control, if storing drawing data in the second storage device is incomplete in the first state upon switching the state of connection from the first state to the second state, the operations of the first storage device, the second storage device, and the third storage device so that an operation of storing, in the first storage device, remaining drawing data which is not stored in the second storage device, and an operation of reading out the drawing data stored in the second storage device and storing the readout drawing data in the third storage device are executed in parallel, and control, if storing drawing data in the first storage device is incomplete in the second state upon switching the state of connection from the second state to the first state, the operations of the first storage device, the second storage device, and the third storage device so that an operation of storing, in the second storage device, remaining drawing data which is not stored in the first storage device, and an operation of reading out the drawing data stored in the first storage device and storing the readout drawing data in the third storage device are executed in parallel.

6. The apparatus according to claim 2, wherein the blanking controller is configured to switch the state of connection from the first state to the second state using the switching device after storing drawing data in the second storage device is completed in the first state, and switch the state of connection from the second state to the first state using the switching device after storing drawing data in the first storage device is completed in the second state.

7. The apparatus according to claim 1, wherein the third storage device has a storage capacity less than each of a storage capacity of the first storage device and a storage capacity of the second storage device, and has a storage speed higher than each of a storage speed of the first storage device and a storage speed of the second storage device.

8. The apparatus according to claim 1, wherein the apparatus is configured to perform the drawing on the substrate with, as the beam, a charged particle beam.

9. A method of manufacturing an article, the method comprising:

performing drawing on a substrate using a drawing apparatus;

developing the substrate on which the drawing has been performed; and processing the developed substrate to manufacture the article, wherein the drawing apparatus performs the drawing on the substrate with a beam, the apparatus including:

a generation device configured to generate drawing data;

a blanking device configured to blank the beam; and a blanking controller configured to control the blanking device, wherein the blanking controller includes a first storage device, a second storage device, and a third storage device configured to respectively store the drawing data generated by the generation device, the blanking controller being configured to control the blanking device based on the drawing data stored in the third storage device, and control operations of the first storage device, the second storage device, and the third storage device so that an operation of storing the drawing data generated by the generation device in a selected one of the first storage device and the second storage device, and an operation of reading out the drawing data stored in the other of the first storage device and the second storage device and storing the readout drawing data in the third storage device are executed in parallel.

10. A drawing method of performing drawing on a substrate with a beam, the method comprising:

causing a generation device to generate drawing data;

causing a blanking controller, which controls a blanking device for blanking the beam, to control operations of first to third storage devices so that an operation of storing the generated drawing data in a selected one of the first and second storage devices, and an operation of reading out the drawing data stored in the other of the first and second storage devices and storing the readout drawing data in the third storage device are executed in parallel; and causing the blanking device to blank the beam based on the drawing data stored in the third storage device.

11. A method of manufacturing an article, the method comprising:

performing drawing on a substrate according to a drawing method;

developing the substrate on which the drawing has been performed; and processing the developed substrate to manufacture the article, wherein the drawing method performs the drawing on the substrate with a beam, the drawing method including:

causing a generation device to generate drawing data;

causing a blanking controller, which controls a blanking device for blanking the beam, to control operations of first to third storage devices so that an operation of storing the generated drawing data in a selected one of the first and second storage devices, and an operation of reading out the drawing data stored in the other of the first and second storage devices and storing the readout drawing data in the third storage device are executed in parallel; and causing the blanking device to blank the beam based on the drawing data stored in the third storage device.

12. A drawing apparatus which performs drawing on a substrate with a beam, the apparatus comprising:

a blanking device configured to blank the beam; and a blanking controller including first to third storage devices and a switching device, and configured to control the blanking device based on drawing data transmitted to the blanking controller, wherein the blanking controller is configured to:

control operations of the first to third storage devices and the switching device to switch states between two states, an operation of storing the drawing data in the first storage device, and an operation of reading out the drawing data stored in the second storage device and storing the readout drawing data from the second storage device in the third storage device being executed in parallel in one of the two states, and an operation of storing the drawing data in the second storage device, and an operation of reading out the drawing data stored in the first storage device and storing the readout drawing data from the first storage device in the third storage device being executed in parallel in the other of the two states, and control the blanking device based on the drawing data stored in the third storage device.

13. A method of manufacturing an article, the method comprising:

performing drawing on a substrate using a drawing apparatus;

developing the substrate on which the drawing has been performed; and processing the developed substrate to manufacture the article, wherein the drawing apparatus performs the drawing on the substrate with a beam, the apparatus including:

a blanking device configured to blank the beam; and a blanking controller including first to third storage devices and a switching device, and configured to control the blanking device based on drawing data transmitted to the blanking controller, wherein the blanking controller is configured to:

control operations of the first to third storage devices and the switching device to switch states between two states, an operation of storing the drawing data in the first storage device, and an operation of reading out the drawing data stored in the second storage device and storing the readout drawing data from the second storage device in the third storage device being executed in parallel in one of the two states, and an operation of storing the drawing data in the second storage device, and an operation of reading out the drawing data stored in the first storage device and storing the readout drawing data from the first storage device in the third storage device being executed in parallel in the other of the two states, and control the blanking device based on the drawing data stored in the third storage device.

* * * * *